(12) United States Patent
Chang

(10) Patent No.: US 7,817,438 B2
(45) Date of Patent: Oct. 19, 2010

(54) TRANSCEIVER MODULE AND PCB STRUCTURE THEREOF

(75) Inventor: Yi-Yang Chang, Taichung (TW)

(73) Assignee: Asia Optical Co., Inc., Taichung (TW)

( * ) Notice: Subject to any disclaimer, the term of this patent is extended or adjusted under 35 U.S.C. 154(b) by 971 days.

(21) Appl. No.: 11/642,530

(22) Filed: Dec. 21, 2006

(65) Prior Publication Data
US 2008/0149377 A1 Jun. 26, 2008

(51) Int. Cl.
*H05K 1/18* (2006.01)
(52) U.S. Cl. .................. 361/761; 361/792; 361/794; 361/818
(58) Field of Classification Search ......... 361/792–795, 361/818; 174/250–258
See application file for complete search history.

(56) References Cited
U.S. PATENT DOCUMENTS

| | | | | |
|---|---|---|---|---|
| 5,069,522 A * | 12/1991 | Block et al. | | 385/39 |
| 6,304,156 B1 * | 10/2001 | Ishizaki et al. | | 333/134 |
| 6,377,464 B1 * | 4/2002 | Hashemi et al. | | 361/760 |
| 6,583,677 B2 * | 6/2003 | Shintani et al. | | 331/107 SL |
| 6,588,931 B2 * | 7/2003 | Betzner et al. | | 374/185 |
| 7,307,220 B2 * | 12/2007 | Barnette | | 174/255 |
| 7,394,027 B2 * | 7/2008 | Kaluzni et al. | | 174/262 |

* cited by examiner

*Primary Examiner*—Tuan T Dinh
(74) *Attorney, Agent, or Firm*—Thomas, Kayden, Horstemeyer & Risley

(57) ABSTRACT

A transceiver module including an adaptor and a PCB is provided. The PCB, connected with the adaptor, has a first signal layer, a second signal layer and a singular ground layer wherein the singular ground layer is set between the first signal layer and the second signal layer. The first signal layer includes a first transmitter circuit region and a first receiver circuit region. The second signal layer includes a second transmitter circuit region and a second receiver circuit region. The singular ground layer includes a ground portion of a third receiver circuit electrically connected with the ground signals of the first and the second receiver circuit region. Beside, the projection area of the singular ground layer onto the first signal layer substantially covers the first transmitter the first receiver circuit region. The ground portion of the third receiver circuit is electrically connected with a ground of the adaptor.

12 Claims, 5 Drawing Sheets

US 7,817,438 B2

TRANSCEIVER MODULE AND PCB STRUCTURE THEREOF

BACKGROUND

1. Field of Invention

The present invention relates to a transceiver module, and more particularly to a transceiver module for restraining electromagnetic interference.

2. Description of Related Art

Generally, the grounding structure of the high frequency transceiver is divided into a single point grounding formation and a multiple points grounding formation. In the transceiver module, the grounding signals of the transmitter and the receiver share only one grounding conductor in the form of the single point grounding but shares separated grounding conductors in the form of the multiple points grounding.

As the description above, the grounding signals of the transmitter and the receiver share only one grounding conductor in the form of the common single point grounding such that the grounding interference caused by the transmitter may affect the receiver. Although the grounding interference between the transmitter and the receiver can be prevented in the form of multiple points grounding, the electromagnetic interference generated by the transmitter during the operation cannot be prevented.

SUMMARY

A transceiver module including an adaptor and a printed circuit board (PCB) is provided. The PCB, connected with the adaptor, has a first signal layer, a second signal layer and a singular ground layer wherein the singular ground layer is set between the first signal layer and the second signal layer. The first signal layer includes a first transmitter circuit region and a first receiver circuit region. The second signal layer includes a second transmitter circuit region and a second receiver circuit region. The singular ground layer includes a ground portion of a third receiver circuit electrically connected with the ground signals of the first receiver circuit region and the second receiver circuit region. Beside, the projection area of the singular ground layer onto the first signal layer substantially covers the first transmitter circuit region and the first receiver circuit region.

The projection area of the ground of the third receiver circuit substantially covers the second transmitter circuit region and the second receiver circuit region.

The transceiver module further includes a case, and the PCB further includes a plurality of bonding pads. The grounding portion of the third receiver circuit region is electrically connected with the bonding pads and the case.

The PCB further includes a dual grounding layer fixed between the first signal layer and the singular ground layer having a grounding portion of a third transmitter circuit and a grounding portion of a fourth receiver circuit. The grounding portion of the third transmitter circuit is electrically connected with the grounding portion of the first and the second transmitter circuit region; the grounding portion of the fourth receiver circuit is electrically connected with the grounding portion of the first, the second and the third receiver circuit region.

The PCB further includes an indentation for containing the adaptor.

These and other embodiments, aspects and features of the invention will be better understood from a detailed description of the preferred embodiments of the invention, which are further described below in conjunction with the accompanying Figures.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIG. 6b is a schematic view of the assembled PCB in FIG. 6a.

DESCRIPTION OF THE PREFERRED EMBODIMENTS

Figure 1:
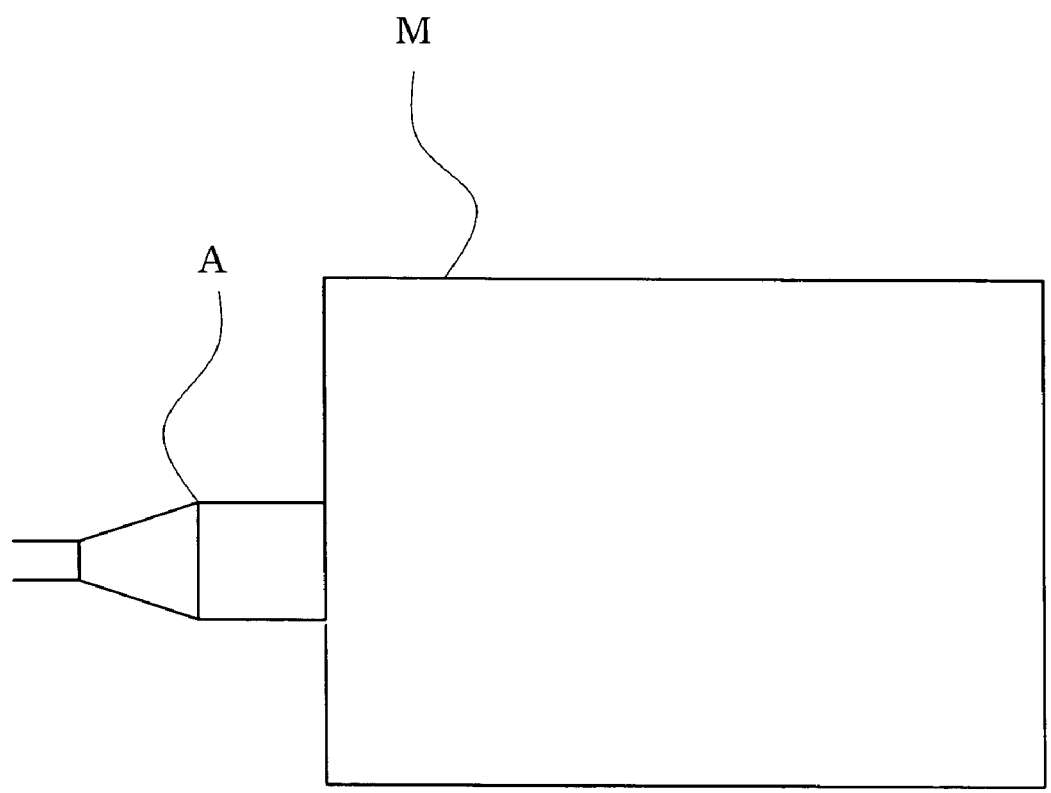
FIG. 1 is a top view of the transceiver module including an adaptor and a PCB structure in accordance with the present invention.

Reference will now be made in detail to the present preferred embodiments of the invention, examples of which are illustrated in the accompanying drawings. Wherever possible, the same reference numbers are used in the drawings and the description to refer to the same or like parts.

While the specification concludes with claims defining the features of the invention that are regarded as novel, it is believed that the invention will be better understood from a consideration of the following description in conjunction with the figures, in which like reference numerals are carried forward.

Refer to FIG. 1. The transceiver module includes an adaptor A and a PCB M consisting of the four layers shown in FIG. 2 to FIG. 6b. The adaptor A may be connected to the PCB M by an optical fiber to transform the optical signal of the fiber into an electrical signal for the PCB.

Figure 4:
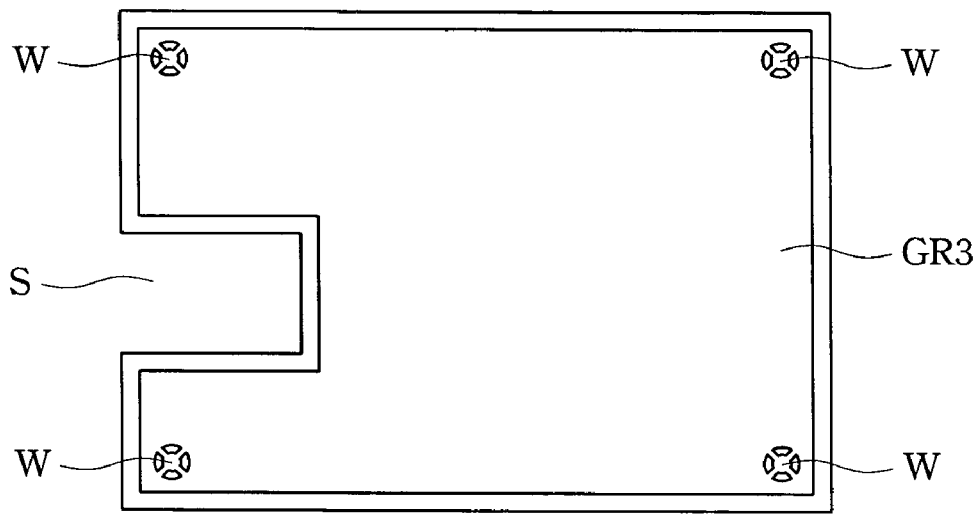
FIG. 4 is a schematic view of a singular grounding layer in accordance with the present invention.
Figure 5:
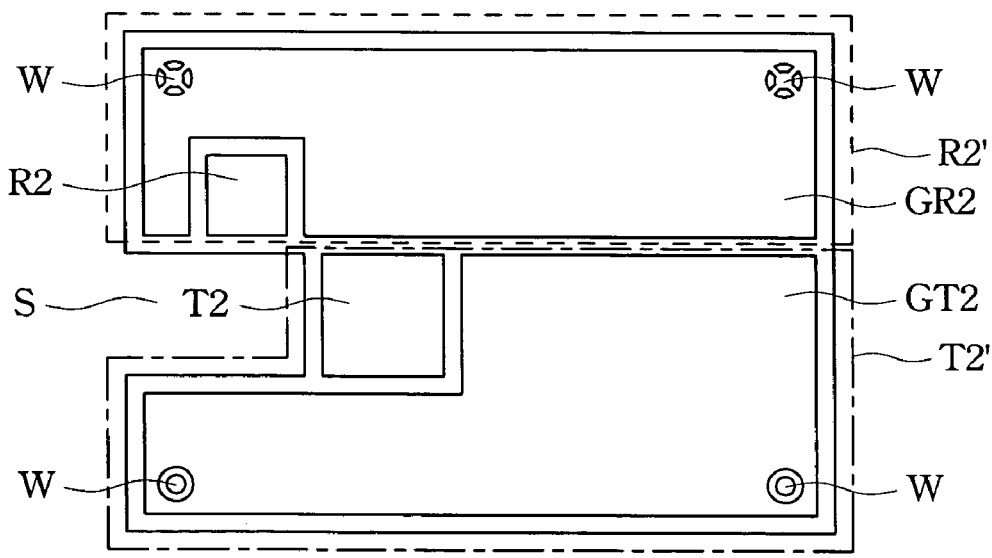
FIG. 5 is a schematic view of a second signal layer in accordance with the present invention.
Figure 6A:
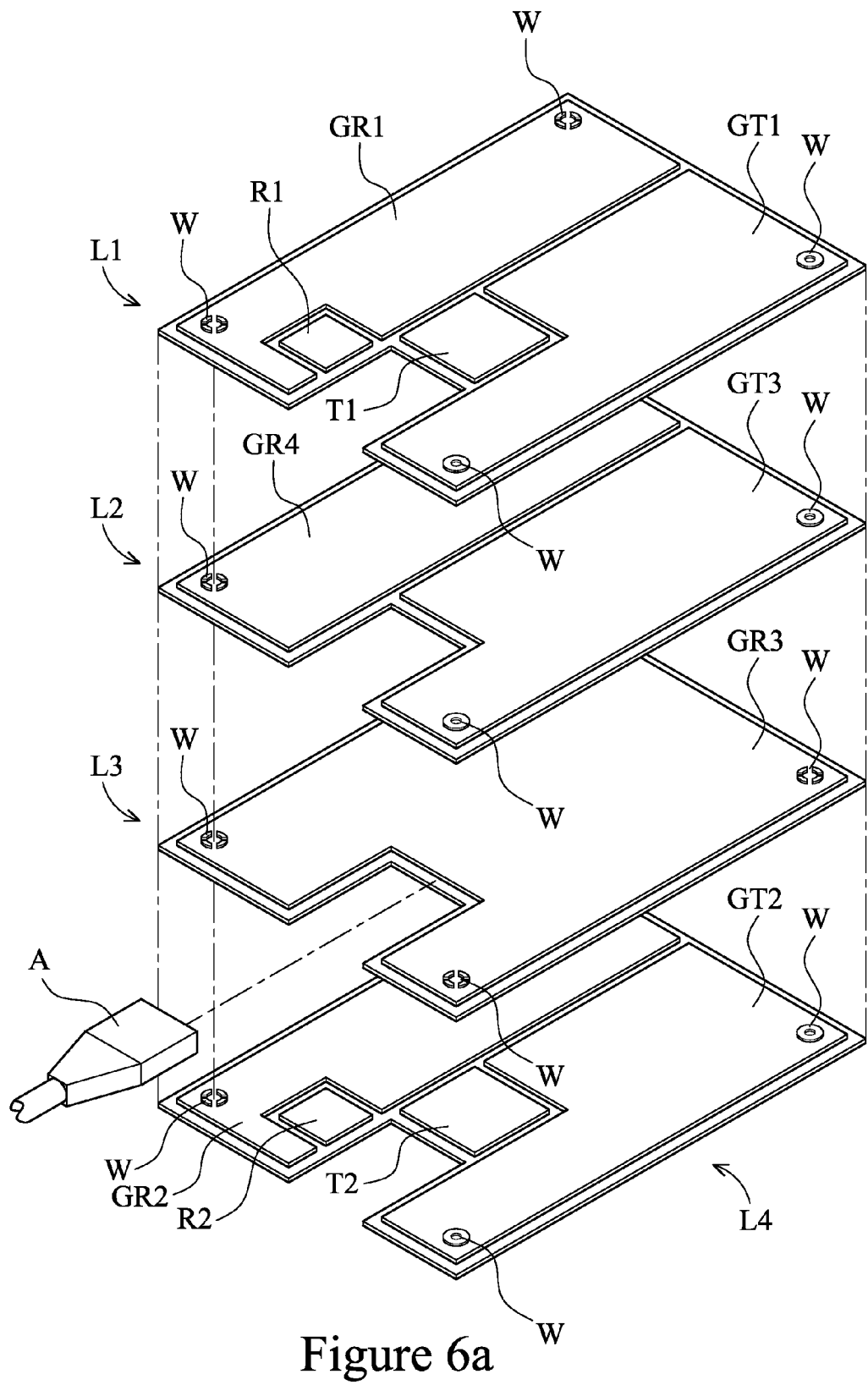
FIG. 6a is an exploded view of the transceiver module in accordance with the present invention.
Figure 6B:
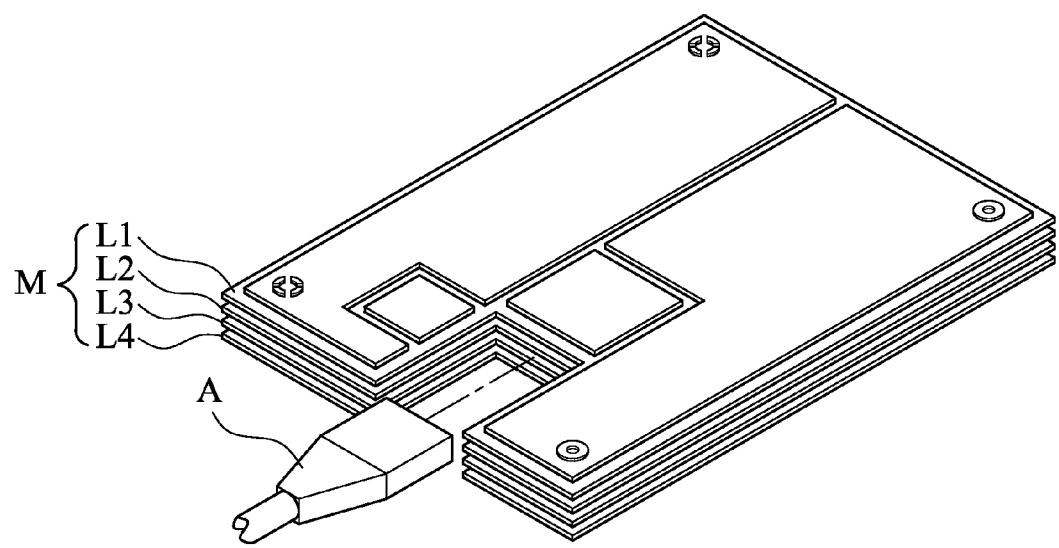

Refer to FIG. 1 to FIG. 6b. The PCB M of the embodiment is a multilayer PCB with four layers, a first signal layer L1, a dual grounding layer L2, a singular grounding layer L3 and a second signal layer L4, respectively shown in FIG. 2 to FIG. 5. These four layers are stacked to one by another, as shown in FIGS. 6a and 6b. By inserting the adaptor A into an indentation S aside the PCB, the first transmitter circuit structure T1 and the first receiver circuit structure R1 of the first signal layer L1 are electrically connected with the second transmitter circuit structure T2 and the second receiver circuit structure R2 of the second signal layer L4.

Figure 2:
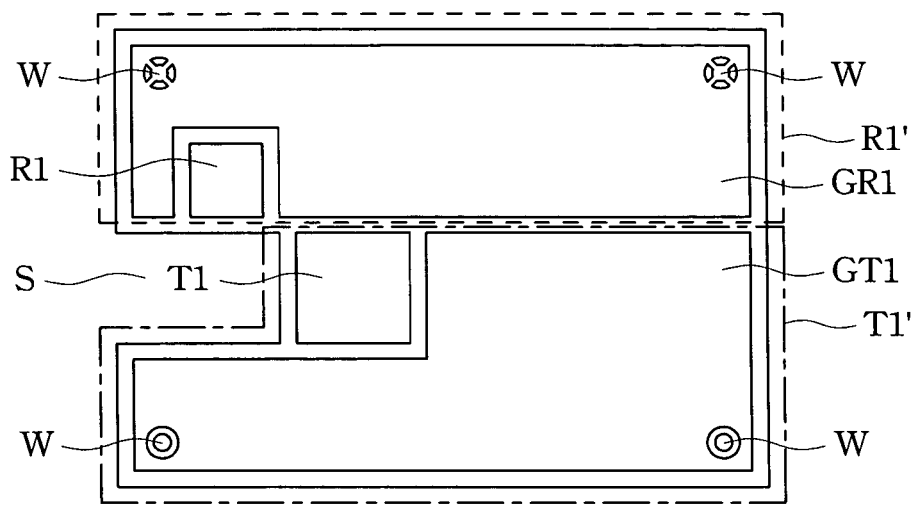
FIG. 2 is a schematic view of a first signal layer in accordance with the present invention.

Refer to FIG. 2. The first signal layer L1, the upper layer of the PCB, includes a first transmitter circuit region T1' and a first receiver circuit region R1'. The first transmitter circuit region T1' includes a first transmitter circuit structure T1 and a first transmitter circuit grounding portion GT1 wherein the grounding signal of the first transmitter circuit structure T1 is conducted with the first transmitter circuit grounding portion GT1. The first receiver circuit region R1' includes a first receiver circuit structure R1 and a first receiver circuit grounding portion GR1 wherein the grounding signal of the first receiver circuit structure R1 is conducted with the first receiver circuit grounding portion GR1.

Refer to FIG. 5. The second signal layer L4 is the lower layer of the PCB, and the circuit block arrangements correspond to the first signal layer L1. The second signal layer L4 includes a second transmitter circuit region T2' and a second receiver circuit region R2'. The second transmitter circuit region T2' includes a second transmitter circuit structure T2 and a second transmitter circuit grounding portion GT2 wherein the grounding signal of the second transmitter circuit structure T2 is conducted with the second transmitter circuit grounding portion GT2. The second receiver circuit region R2' includes a second receiver circuit structure R2 and a second receiver circuit grounding portion GR2 wherein the grounding signal of the second receiver circuit structure R2 is conducted with the second receiver circuit grounding portion GR2.

Figure 3:
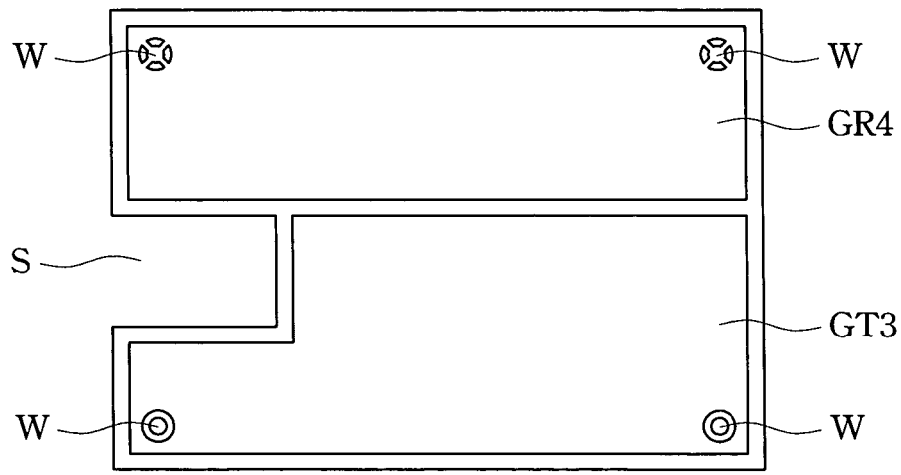
FIG. 3 is a schematic view of a dual grounding layer in accordance with the present invention.

Refer to FIG. 3 and FIG. 4. The dual grounding layer L2 and the singular grounding layer L3 are both grounding structures. The singular grounding layer L3 merely includes a third receiver circuit grounding portion GR3 such that single electricity is provided. The dual grounding layer L2 includes a third transmitter circuit grounding portion GT3 and a fourth receiver circuit grounding portion GR4 respectively having individual electricity such that two electrical inputs are provided. The dual grounding layer L2 is located between the first signal layer L1 and the singular grounding layer L3. The singular grounding layer L3 is located between the dual grounding layer L2 and the second signal layer L4.

In this embodiment, the first transmitter circuit grounding portion GT1, the second transmitter circuit grounding portion GT2 and the third transmitter circuit grounding portion GT3 are electrically connected with each other through the vias perpendicular to the circuit board surface. The first receiver circuit grounding portion GR1, the second receiver circuit grounding portion GR2, the third receiver circuit grounding portion GR3 and the fourth receiver circuit grounding portion GR4 are electrically connected with each other through the via, and further electrically connected with a ground (not shown) of the adaptor A and the bounding pads W arranged in four corners of the PCB, as shown in FIG. 6a.

As shown in FIG. 6a, the projection area of the third receiver circuit grounding portion GR3 upon the first signal layer L1 substantially covers the first transmitter circuit region T1' and the first receiver circuit region R1'; the projection area of the third receiver circuit grounding portion GR3 upon the second signal layer L4 substantially covers the second transmitter circuit region T2' and the second receiver circuit region R2'.

Therefore, the electromagnetic interference caused by the first transmitter circuit region T1' and the second transmitter circuit region T2' during the operation is reduced through the PCB structure of the embodiment. In this embodiment, the projection area of the third receiver circuit grounding portion GR3 upon the first signal layer L1 and the second signal layer L4 substantially covers the first and second transmitter circuit region T1' and T2' and the first and second receiver circuit region R1' and R2'. Further, the first receiver circuit grounding portion GR1, the second receiver circuit grounding portion GR2, the third receiver circuit grounding portion GR3 and the fourth receiver circuit grounding portion GR4 are electrically connected with the case (not shown) of the transceiver module through the bonding pads W. Therefore, the grounding area of the first receiver circuit region R1' and the second receiver circuit region R2' is increased to reduce the electromagnetic interference caused by the first transmitter circuit structure T1 and the second transmitter circuit structure T2. As a result, the cross talk effect is restricted.

Although the present invention has been described in considerable detail with reference to certain preferred embodiments thereof, other embodiments are possible. Therefore, their spirit and scope of the appended claims should no be limited to the description of the preferred embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A transceiver module, comprising:
   an adaptor; and
   a printed circuit board connected with the adaptor, comprising:
      a first signal layer, comprising:
         a first transmitter circuit region including a first transmitter circuit grounding portion; and
         a first receiver circuit region including a first receiver circuit grounding portion;
      a second signal layer, comprising:
         a second transmitter circuit region including a second transmitter circuit grounding portion; and
         a second receiver circuit region including a second receiver circuit grounding portion wherein the first transmitter circuit grounding portion is conducted with the second transmitter circuit grounding portion, and the first receiver circuit grounding portion is conducted with the second receiver circuit grounding portion; and
      a grounding layer, located between the first signal layer and the second signal layer and comprising a third receiver circuit grounding portion electrically connected with the first receiver circuit grounding portion and the second receiver circuit grounding portion;
   wherein a projection area of the third receiver circuit grounding portion upon the first signal layer covers the first transmitter circuit region and the first receiver circuit region, and the third receiver circuit grounding portion is electrically connected with a grounding of the adaptor.

2. The transceiver module of claim 1, wherein the projection area of the third receiver circuit grounding portion upon the second signal layer covers the second transmitter circuit region and the second receiver circuit region.

3. The transceiver module of claim 1, further comprising a case and the printed circuit board further comprising multiple bonding pads wherein the third receiver circuit grounding portion is electrically connected with the bonding pads and the case.

4. The transceiver module of claim 1, wherein the printed circuit board further comprises a dual grounding layer comprising:
   a third transmitter circuit grounding portion, electrically connected with the first transmitter circuit grounding portion and the second transmitter circuit grounding portion; and
   a fourth receiver circuit grounding portion, electrically connected with the first receiver circuit grounding portion, the second receiver circuit grounding portion and the third receiver circuit grounding portion.

5. The transceiver module of claim 1, wherein the dual grounding layer is located between the first signal layer and the grounding layer.

6. The transceiver module of claim 1, wherein the printed circuit board further comprises an indentation containing the adaptor.

7. A printed circuit board applied to a transceiver module, comprising:
- a first signal layer, comprising:
  - a first transmitter circuit region including a first transmitter circuit grounding portion; and
  - a first receiver circuit region including a first receiver circuit grounding portion;
- a second signal layer, comprising:
  - a second transmitter circuit region including a second transmitter circuit grounding portion; and
  - a second receiver circuit region including a second receiver circuit grounding portion wherein the first transmitter circuit grounding portion is conducted with the second transmitter circuit grounding portion, and the first receiver circuit grounding portion is conducted with the second receiver circuit grounding portion; and
- a grounding layer, located between the first signal layer and the second signal layer and comprising a third receiver circuit grounding portion electrically connected with the first receiver circuit grounding portion and the second receiver circuit grounding portion;

wherein a projection area of the third receiver circuit grounding portion upon the first signal layer covers the first transmitter circuit region and the first receiver circuit region, and the third receiver circuit grounding portion is electrically connected with a grounding of an adaptor.

8. The printed circuit board of claim 7, wherein the projection area of the third receiver circuit grounding portion upon the second signal layer covers the second transmitter circuit region and the second receiver circuit region.

9. The printed circuit board of claim 7, further comprising multiple bonding pads electrically connected with the third receiver circuit grounding portion.

10. The printed circuit board of claim 7, further comprising a dual grounding layer comprising:
- a third transmitter circuit grounding portion, electrically connected with the first transmitter circuit grounding portion and the second transmitter circuit grounding portion; and
- a fourth receiver circuit grounding portion, electrically connected with the first receiver circuit grounding portion, the second receiver circuit grounding portion and the third receiver circuit grounding portion.

11. The printed circuit board of claim 7, further comprises an indentation containing the adaptor.

12. The printed circuit board of claim 10, wherein the dual grounding layer is located between the first signal layer and the grounding layer.

* * * * *